(12) United States Patent
Conley, Jr. et al.

(10) Patent No.: US 7,199,029 B2
(45) Date of Patent: Apr. 3, 2007

(54) SELECTIVE DEPOSITION OF ZNO NANOSTRUCTURES ON A SILICON SUBSTRATE USING A NICKEL CATALYST AND EITHER PATTERNED POLYSILICON OR SILICON SURFACE MODIFICATION

(75) Inventors: John F. Conley, Jr., Camas, WA (US);
Lisa H. Stecker, Vancouver, WA (US);
Gregory M. Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 152 days.

(21) Appl. No.: 10/956,786

(22) Filed: Oct. 1, 2004

(65) Prior Publication Data

US 2006/0071207 A1    Apr. 6, 2006

(51) Int. Cl.
*H01L 21/20* (2006.01)
(52) U.S. Cl. .................. 438/478; 977/762; 977/773; 977/811
(58) Field of Classification Search ........... 977/762, 977/773, 811; 438/478
See application file for complete search history.

(56) References Cited

U.S. PATENT DOCUMENTS

| | | | | |
|---|---|---|---|---|
| 6,451,113 | B1 * | 9/2002 | Givargizov | ............. 117/205 |
| 2003/0126742 | A1 * | 7/2003 | Ting et al. | ............. 29/874 |
| 2005/0133476 | A1 * | 6/2005 | Islam et al. | ............. 216/2 |
| 2005/0191774 | A1 * | 9/2005 | Li et al. | ............. 438/22 |
| 2005/0253220 | A1 * | 11/2005 | Lin et al. | ............. 257/536 |

OTHER PUBLICATIONS

Wolf et al. Silicon Processing for the VLSI Era, vol. 1: Process Technology. 2nd Ed, Lattice Press: Sunset Beach, CA, 2000, pp. 686-688.*
Article entitled, "Vapor-Liquid-Solid Mechanism of Single Crystal Growth" by Wagner et al., published in Applied Physics Letters, vol. 4, No. 5, Mar. 1, 1964, pp. 89-90.
Article entitled, "Controlled Growthof ZnO Nanowires and Their Optical Properties", by Yan et al., published in Adv. Funct. Mater, 2002, 12, No. 5 May, pp. 323-331.
Article entitled, "Nanoscale Science and Technology: Building a Big Future from Small Things", by C. M. Lieber, published in MRS Bulletin/Jul. 2003, pp. 486-491.
Article entitled, "Room-Temperature Ultraviolet Nanowire Nanolasers", by Huang et al., published in Science, vol. 292, Jun. 8, 2001, pp. 1897-1899.

* cited by examiner

*Primary Examiner*—Carl Whitehead, Jr.
*Assistant Examiner*—Colleen E. Rodgers
(74) *Attorney, Agent, or Firm*—The Office of Gerald Maliszewski; Gerald Maliszewski

(57) ABSTRACT

Zinc-oxide nanostructures are formed by forming a pattern on a surface of a substrate. A catalyst metal, such as nickel, is formed on the surface of the substrate. Growth of at least one zinc oxide nanostructure is induced on the catalyst metal substantially over the pattern on the surface of the substrate based on a vapor-liquid-solid technique. In one exemplary embodiment, inducing the growth of at least one zinc-oxide nanostructure induces growth of each zinc-oxide nanostructure substantially over a patterned polysilicon layer. In another exemplary embodiment, when growth of at least one zinc-oxide nanostructure is induced, each zinc-oxide nanostructure grows substantially over an etched silicon substrate layer.

10 Claims, 6 Drawing Sheets

US 7,199,029 B2

SELECTIVE DEPOSITION OF ZnO NANOSTRUCTURES ON A SILICON SUBSTRATE USING A NICKEL CATALYST AND EITHER PATTERNED POLYSILICON OR SILICON SURFACE MODIFICATION

BACKGROUND OF THE INVENTION

1. Field of the Invention

The present invention relates to nanotechnology and/or microelectronics. In particular, the present invention relates a method for forming zinc-oxide (ZnO) nanostructures on a silicon (Si) substrate.

2. Description of the Related Art

Nanostructured materials, such as nanowires, nanorods, nanofibers, whiskers, etc., exhibit interesting optical and electronic properties and have been demonstrated for many applications, such as chemical and bio sensors and detectors, LEDs, transistors, lasers, field emitters, etc. See, for example, P. Yang et al., "Controlled growth of ZnO nanowires and their optical properties," Adv. Func. Mat. 12(5), 323 (2002) and C. M. Lieber, "Nanoscale science and technology: Building a big future from small things," MRS Bulletin, pp. 486–491, (July 2003). Zinc oxide (ZnO), in particular, exhibits many interesting properties for nanostructures that could be useful for solid-state optoelectronic light emitters, chemical sensors, and gas detectors.

Many materials, such as silicon (Si), germanium (Ge), and other elemental and binary semiconductors, and zinc oxide (ZnO) have been made into nanostructures. One of the primary techniques used for forming nanostructures is vapor-liquid-solid (VLS) growth. Other techniques, such as laser ablation and arc discharge, have also been used to form nanostructures. A VLS growth mechanism typically requires a metal catalyst. At an appropriate temperature range, the catalyst forms a liquid solution with the desired growth material. When the liquid droplet becomes supersaturated with the desired growth material, the desired material nucleates, resulting in growth of a nanostructure. For example, a thin film (~3 nm) of a catalyst, such as gold (Au), is often used. Nanostructures are observed to grow wherever Au is present. Selective growth of nanostructures is conventionally achieved by patterning the Au catalyst either by dispersing Au nanoparticles onto a substrate, or by evaporating Au through a patterned shadow mask.

Nevertheless, dispersing particles onto a substrate in the ultra clean environments used for microelectronic fabrication is not desirable. Additionally, the metals used as catalysts for nanostructure growth are typically difficult to etch and, consequently, are difficult to subtractively pattern. Moreover, the metals used as catalysts are typically difficult to chemical mechanical polish (CMP). Accordingly, nanostructure catalyst materials are typically difficult to pattern via conventional microelectronic processes.

What is needed is a technique for forming nanostructures that does not require patterning of a metal catalyst.

SUMMARY OF THE INVENTION

The present invention provides a technique for forming nanostructures that does not require patterning of a metal catalyst.

The advantages of the present invention are provided by a technique for forming zinc-oxide nanostructures. A pattern is formed on a surface of a substrate. A catalyst metal is formed on the surface of the substrate. Growth of at least one zinc oxide nanostructure is induced on the catalyst metal substantially over the pattern on the surface of the substrate based on a vapor-liquid-solid technique. In one exemplary embodiment of the present invention, the catalyst metal is nickel. In other exemplary embodiments of the present invention, the catalyst metal can be selected from the group including platinum, silver, palladium, copper, and gold.

In one exemplary embodiment of the present invention, forming a pattern on the surface of the substrate includes forming a silicon substrate layer. A polysilicon layer is then formed on the silicon substrate layer. The polysilicon layer is etched to form the pattern. For this exemplary embodiment, each zinc-oxide nanostructure grows substantially over the patterned polysilicon layer.

In another exemplary embodiment of the present invention, forming a pattern on the surface of the substrate includes forming a silicon substrate layer. A silicon-oxide layer is formed on the silicon substrate layer. The silicon-oxide layer and the silicon substrate layer are etched to form the pattern. The etching process overetches the silicon substrate layer to a depth of about 5 nm. For this exemplary embodiment, when growth of at least one zinc-oxide nanostructure is induced, each zinc-oxide nanostructure grows substantially over the etched silicon substrate layer.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE PRESENT INVENTION

The present invention provides two techniques for achieving selective growth of ZnO nanostructures on a Si substrate that avoid direct patterning of a catalyst material. In one exemplary embodiment, the present invention patterns polysilicon that is beneath a blanket layer of a metal catalyst. In another exemplary embodiment, the present invention modifies the Si surface beneath a blanket layer of a metal catalyst. In both embodiments, the difficulties associated with directly patterning the catalyst metal are avoided.

Figure 1:
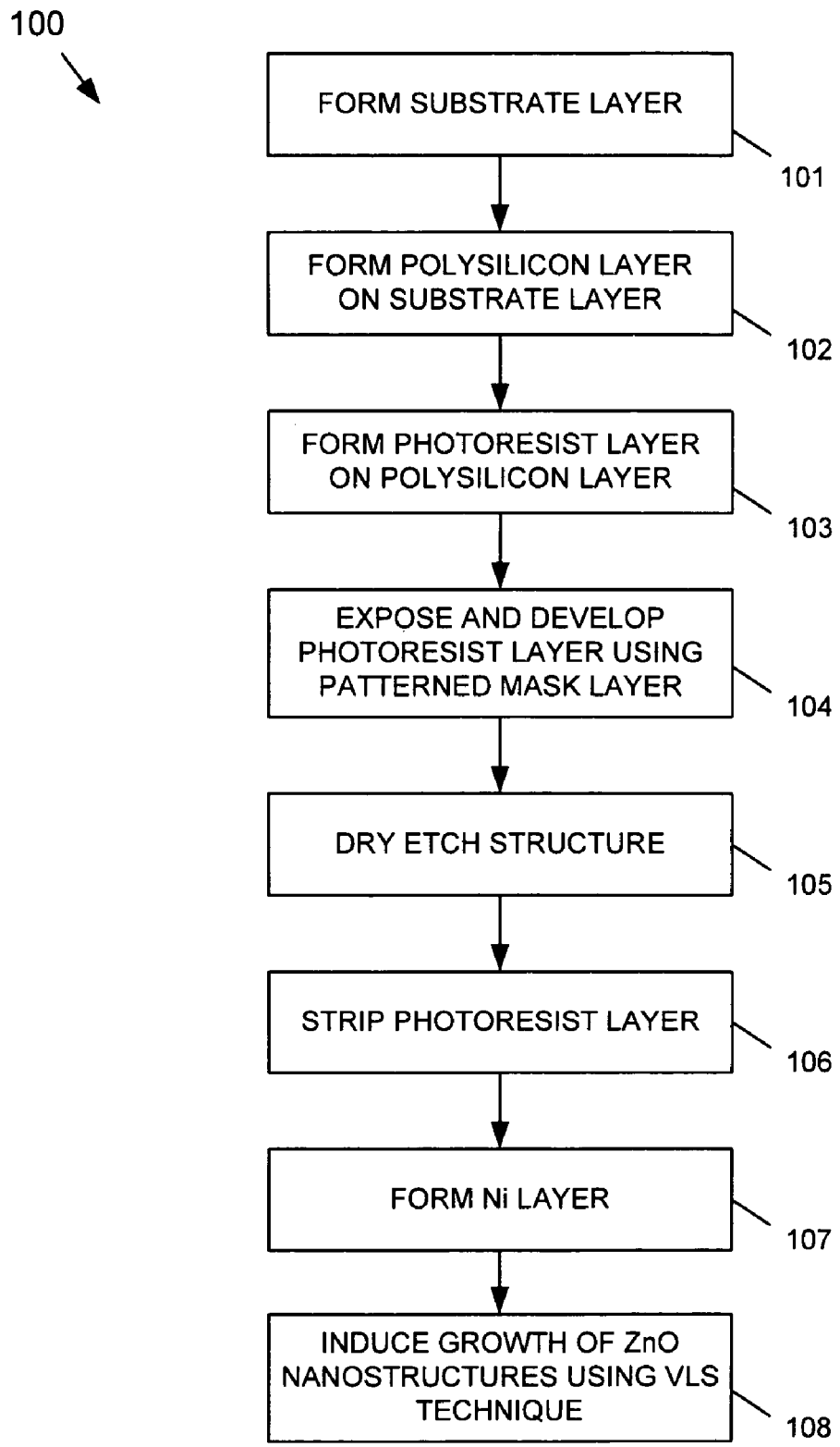
FIG. 1 depicts a flowchart for a first exemplary embodiment of a technique for forming ZnO nanostructures according to the present invention.

FIG. 1 depicts a flowchart for a first exemplary embodiment 100 of a technique for forming ZnO nanostructures according to the present invention. FIGS. 2A–2F depict a sequence of cross-sectional views of a substrate and ZnO nanostructures that are formed according to the present invention. At step 101 in FIG. 1, a clean Si <100> or Si <111> starting wafer is used as a substrate layer 201. Alternatively, substrate layer 201 could be formed from silicon dioxide ($SiO_2$). At step 102, a polysilicon layer 202 is formed on substrate layer 201 using a well-known technique, such as an LPCVD technique. In principle, polysilicon layer 202 could have any thickness between about 5 nm and about 1000 nm. For example, in one exemplary embodiment of the present invention, a polysilicon layer 202 that is 100 nm thick is formed on substrate layer 201 using an LFCVD technique at 570° C. At step 103, the wafer structure formed by substrate 201 and polysilicon layer 202 is coated with a layer of photoresist 203.

Figure 2A:
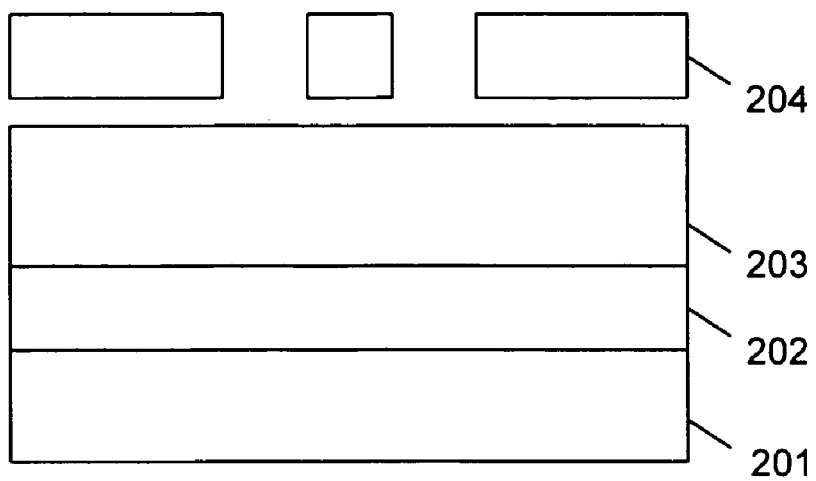
FIGS. 2A–2F depict a sequence of cross-sectional views of a substrate and ZnO nanostructures that are formed according to the present invention.

At step 104, photoresist layer 203 is exposed and developed using a patterned mask layer 204. FIG. 2A depicts a cross-sectional view of the wafer structure formed by substrate layer 201, polysilicon layer 202, photoresist layer 203 and a patterned mask layer 204 before photoresist layer 203 is exposed and developed.

Figure 2B:
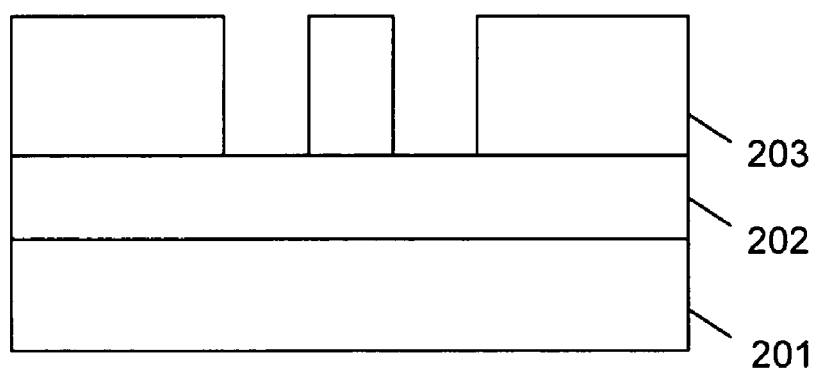
Figure 2C:
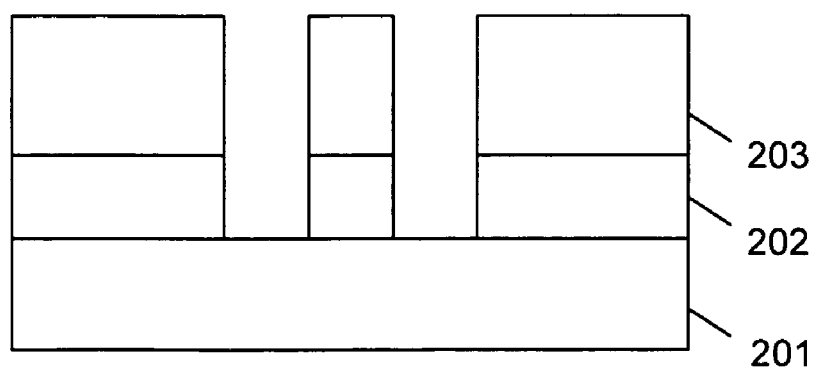

At step 105, the wafer structure is dry etched. FIG. 2B depicts a cross-sectional view of the wafer structure after dry etching. For example, a standard poly etch using chorine ($Cl_2$) and bromine ($Br_2$) gases could be used, followed by a highly selective low-bias $Br_2$ gas etch in step 105 to provide an undamaged surface of Si. FIG. 2C depicts a cross-sectional view of the wafer structure after etching. A layer of, for example, $SiO_2$ could be inserted between layer 201 and layer 202 to allow for better selectivity of the etch process and for reducing chance of damage to Si substrate 201.

Figure 2D:
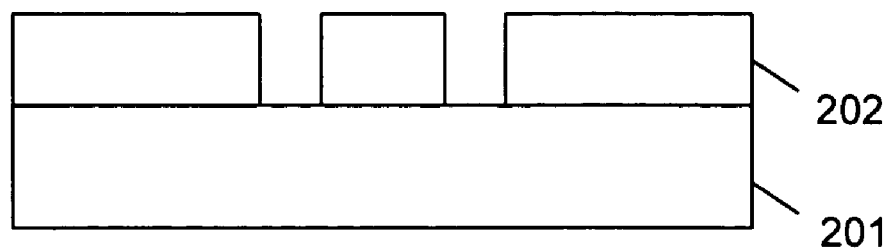

At step 106, photoresist layer 203 is stripped in a well-known manner, followed by a hydrofluoric acid (HF) dip to remove photoresist polymer from the surface of the wafer structure. FIG. 2D depicts a cross-sectional view of the wafer structure after photoresist layer 203 has been stripped.

Figure 2E:
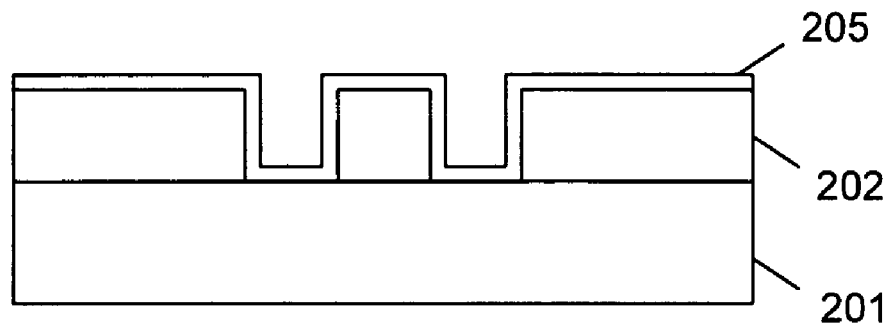

At step 107, a layer 205 of nickel (Ni) that is approximately 3 nm is deposited using an e-beam evaporator. FIG. 2E depicts a cross-sectional view of the wafer structure after layer 205 has been deposited. The exact thickness of the Ni layer and the Ni deposition technique is not critical. Ni is used as a catalyst metal instead of Au because Au is a fast diffuser and creates deep levels in the Si forbidden gap.

At step 108, a conventional VLS method is used for inducing growth of ZnO nanostructures. In particular, the wafer structure depicted in FIG. 2E is exposed to Zn vapor in the presence of a trace amount of oxygen at about 900° C. for about 30 min. Zinc vapor is generated by, for example, carbothermal reduction of ZnO power using equal parts of ZnO and graphite. In principle, however, any method of supplying gaseous phase Zn for growing ZnO nanostructures would be suitable.

Figure 2F:
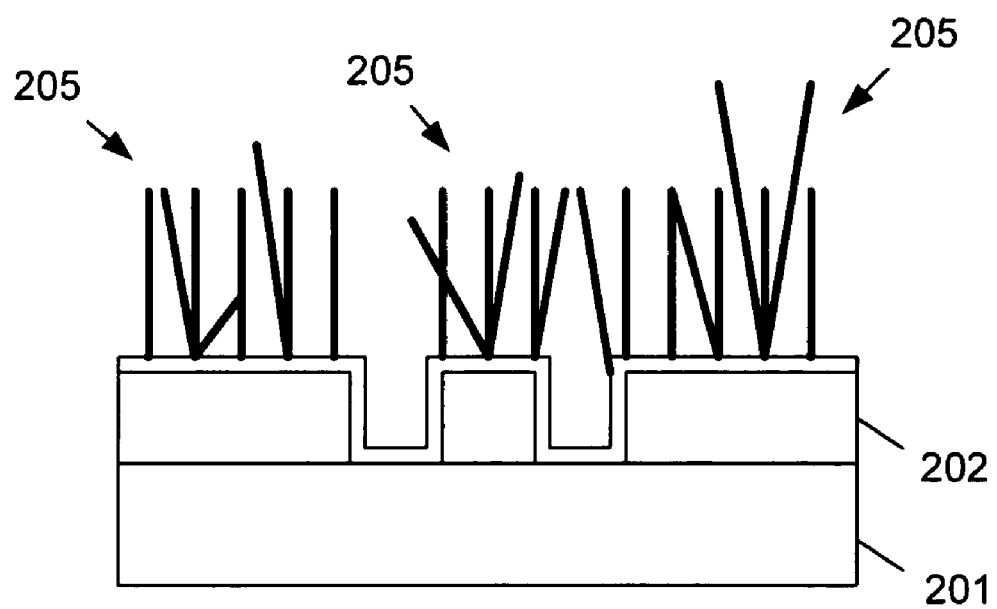

FIG. 2F depicts selective growth of ZnO nanostructures 205 substantially only at regions where Ni has been formed on polysilicon. The underlying polysilicon provides nucleation for nanostructure growth.

Figure 3:
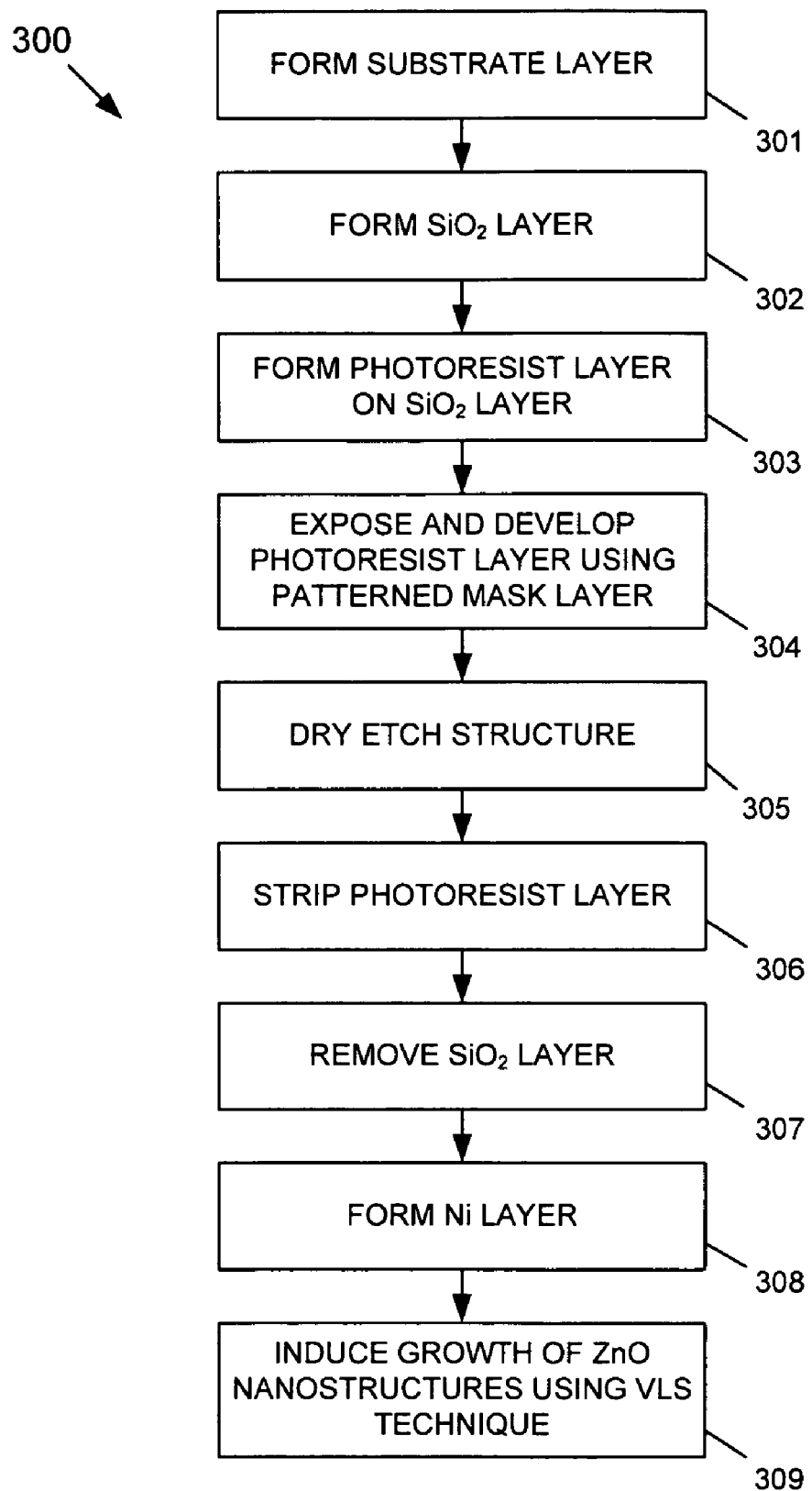
FIG. 3 depicts a flowchart for a second exemplary embodiment of a technique for forming ZnO nanostructures according to the present invention.

FIG. 3 depicts a flowchart for a second exemplary embodiment 300 of a technique for forming ZnO nanostructures according to the present invention. FIGS. 4A–4F depict a sequence of cross-sectional views of a substrate and ZnO nanostructures that are formed according to the present invention.

At step 301 in FIG. 3, a clean Si <100> or Si <111> starting wafer is used as a substrate layer 401. At step 302, substrate layer 401 is oxidized to form $SiO_2$ layer 402. Alternatively, $SiO_2$ layer 402 could be deposited on substrate layer 401. $SiO_2$ layer 402 could be, for example, 100 nm thick. In principle, $SiO_2$ layer 402 could have any thickness between about 5 nm and about 1000 nm. At step 303, a photoresist layer 403 is formed on $SiO_2$ layer 402.

Figure 4A:
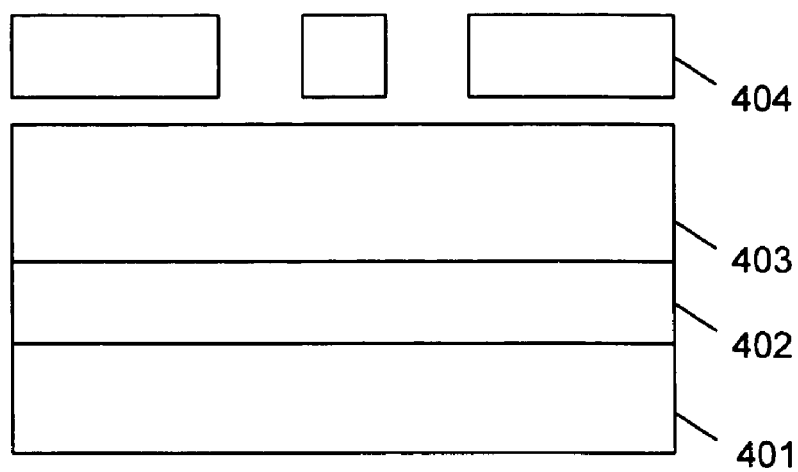
FIGS. 4A–4F depict a sequence of cross-sectional views of a substrate and ZnO nanostructures that are formed according to the present invention.

At step 304, photoresist layer 403 is exposed and developed using a patterned mask layer 404. FIG. 4A depicts a cross-sectional view of the wafer structure formed by substrate layer 401, $SiO_2$ layer 402, photoresist layer 403 and a patterned mask layer 404 before photoresist layer 403 is exposed and developed.

Figure 4B:
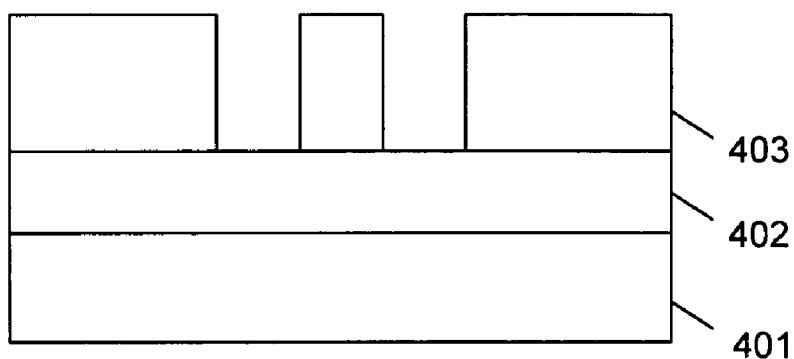
Figure 4C:
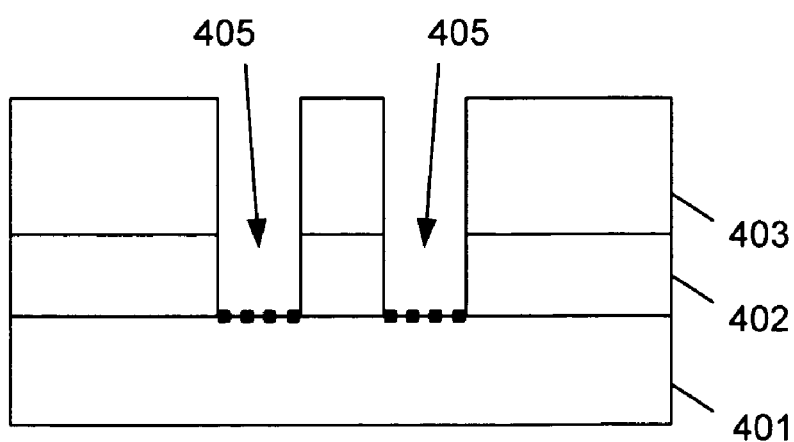

At step 305, the wafer structure is dry etched using $C_3F_8$ fluorine gas at 1800 W power and at 600 W bias, with a 10% overetch. The overetch provides a minimal etch induced damage on the surface of Si substrate 401 of about 5 nm deep. FIG. 4B depicts a cross-sectional view of the wafer structure after dry etching. FIG. 4C depicts a cross-sectional view of the wafer structure after overetching. The induced damage on the surface of substrate 401 is depicted as small, darkened squares 405.

Figure 4D:
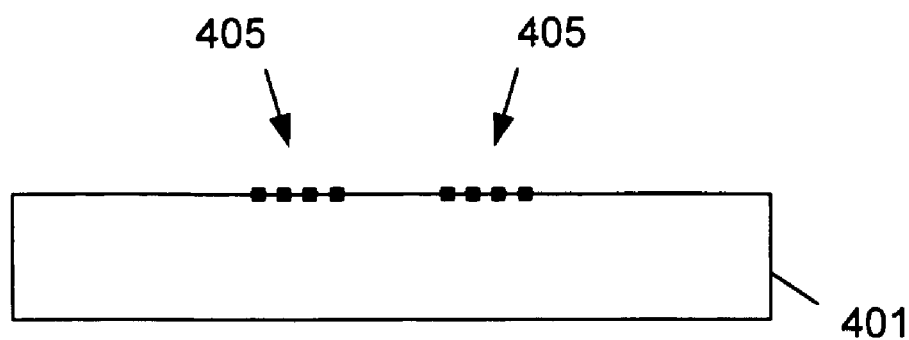

At step 306, photoresist layer 403 is stripped in a well-known manner. At step 307, $SiO_2$ layer 402 is optionally removed using a standard oxide removal method, such as an HF wet etch. FIG. 4D depicts a cross-sectional view of the wafer structure after photoresist layer 403 and $SiO_2$ layer 402 have been removed.

Figure 4E:
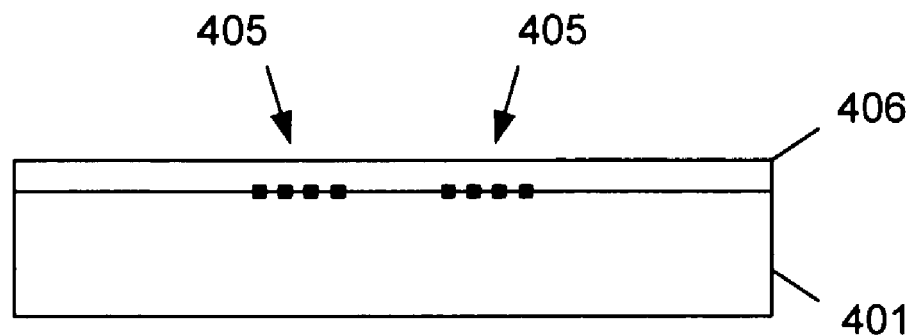

At step 308, a Ni layer 406 that is approximately 3 nm thick is deposited using an e-beam evaporator in a well-known manner. FIG. 4E depicts a cross-section view of the wafer structure after Ni layer 406 has been formed. The exact thickness of the Ni layer and the Ni deposition technique is not critical. Again, Ni is used as a catalyst metal instead of Au because Au is a fast diffuser and creates deep levels in the Si forbidden gap.

At step 309, a conventional VLS method is used for inducing growth of ZnO nanostructures. In particular, the wafer structure depicted in FIG. 4E is exposed to Zn vapor in the presence of a trace amount of oxygen at about 900° C. for about 30 min. Zinc vapor is generated by, for example, carbothermal reduction of ZnO power using equal parts of ZnO and graphite. In principle, however, any method of supplying gaseous phase Zn for growing ZnO nanostructures would be suitable.

Figure 4F:
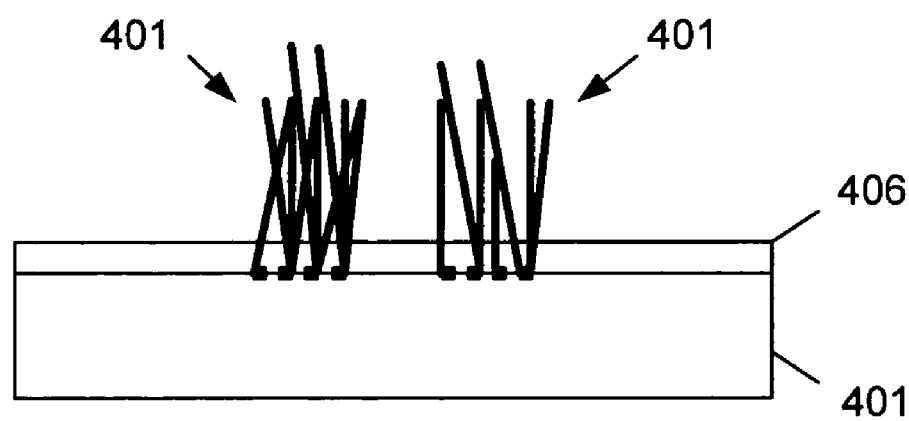

FIG. 4F depicts selective growth of ZnO nanostructures 407 substantially only at regions where Ni has been formed over the overetched regions.

It should be understood that other catalyst metals, such as platinum (Pt), silver (Ag), palladium (Pd), copper (Cu) and gold (Au) could be used with the present invention.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a zinc-oxide nanostructure, comprising:
    forming a pattern on a surface of a substrate as follows:
        forming a silicon substrate layer;
        forming a silicon-oxide layer on the silicon substrate layer; and
        etching the silicon-oxide layer and the silicon substrate layer to form the pattern;
    forming a blanket layer of catalyst metal on the surface of the substrate, including the pattern on the surface and unpatterned surface; and
    inducing growth of each zinc-oxide nanostructure on the catalyst metal substantially over the etched silicon substrate layer.

2. The method according to claim 1, wherein the catalyst metal is nickel.

3. The method according to claim 1, wherein the catalyst metal is selected from the group including platinum, silver, palladium and copper.

4. The method according to claim 1, wherein etching the silicon-oxide layer and the silicon substrate layer etches the silicon substrate layer to a depth of about 5 nm.

5. The method according to claim 1, wherein inducing growth of each zinc-oxide nanostructure on the catalyst metal is based on a vapor-liquid-solid technique.

6. A zinc-oxide nanostructure formed by:
   forming a pattern on a surface of a substrate as follows:
      forming a silicon substrate layer;
      forming a silicon-oxide layer on the silicon substrate layer; and
      etching the silicon-oxide layer and the silicon substrate layer to form the pattern;
   forming a blanket layer of catalyst metal on the surface of the substrate, including the pattern on the surface and unpatterned surface; and
   inducing growth of each zinc oxide nanostructure on the catalyst metal substantially over the etched silicon substrate layer.

7. The zinc-oxide nanostructure according to claim 6, wherein the catalyst metal is nickel.

8. The zinc-oxide nanostructure according to claim 6, wherein the catalyst metal is selected from the group including platinum, silver, palladium and copper.

9. The zinc-oxide nanostructure according to claim 6, wherein etching the silicon-oxide layer and the silicon substrate layer etches the silicon substrate layer to a depth of about 5 nm.

10. The zinc-oxide nanostructure according to claim 6, wherein inducing growth of each zinc-oxide nanostructure on the catalyst metal is based on a vapor-liquid-solid technique.

* * * * *